US012683564B2

(12) United States Patent
Chang et al.

(10) Patent No.: US 12,683,564 B2
(45) Date of Patent: Jul. 14, 2026

(54) RFIC WITH SUBSTRATE PARTITION

(71) Applicant: Taiwan Semiconductor Manufacturing Company, Ltd., Hsinchu (TW)

(72) Inventors: Wei Ling Chang, Hsinchu (TW); Hsieh-Hung Hsieh, Hsinchu (TW); Tzu-Jin Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 567 days.

(21) Appl. No.: 18/320,709

(22) Filed: May 19, 2023

(65) Prior Publication Data

US 2024/0388266 A1     Nov. 21, 2024

(51) Int. Cl.
| | |
|---|---|
| *H03F 3/195* | (2006.01) |
| *H03F 1/56* | (2006.01) |
| *H03F 3/24* | (2006.01) |
| *H10W 90/00* | (2026.01) |
| *H10W 90/20* | (2026.01) |

(52) U.S. Cl.
CPC ............. *H03F 3/245* (2013.01); *H03F 1/565* (2013.01); *H03F 2200/222* (2013.01); *H03F 2200/387* (2013.01); *H03F 2200/451* (2013.01); *H10W 90/00* (2026.01); *H10W 90/297* (2026.01)

(58) Field of Classification Search
CPC .................................. H03F 3/195; H03F 3/191
USPC ................................................. 330/307, 302
See application file for complete search history.

(56) References Cited

U.S. PATENT DOCUMENTS

| | | | | |
|---|---|---|---|---|
| 6,621,134 B1 * | 9/2003 | Zurn | ................... | B81C 1/00246 |
| | | | | 333/197 |
| 8,754,533 B2 | 6/2014 | Or-Bach et al. | | |
| 8,847,689 B2 * | 9/2014 | Zhao | ...................... | H03F 3/189 |
| | | | | 330/285 |
| 8,966,426 B1 | 2/2015 | Liu et al. | | |
| 10,622,736 B2 * | 4/2020 | Kermalli | ................ | H01R 12/57 |
| 11,128,333 B2 | 9/2021 | Yang et al. | | |
| 11,424,539 B2 | 8/2022 | Alpman et al. | | |
| 11,705,875 B2 * | 7/2023 | Koya | .................. | H01F 27/2804 |
| | | | | 330/307 |
| 11,978,723 B2 | 5/2024 | Yang et al. | | |
| 2005/0098906 A1 * | 5/2005 | Satoh | ................... | C23C 16/455 |
| | | | | 438/758 |

(Continued)

FOREIGN PATENT DOCUMENTS

| | | |
|---|---|---|
| TW | 201838352 A | 10/2018 |
| TW | 202240778 A | 10/2022 |
| WO | 2019/128974 A1 | 7/2019 |

OTHER PUBLICATIONS

Hu et al., "3D Multi-chip Integration with System on Integrated Chips (SoIC)," Symposium on VLSI Technology Digest of Technical Papers, pp. T20-T21 (2019).

(Continued)

*Primary Examiner* — Henry Choe
(74) *Attorney, Agent, or Firm* — Merchant & Gould P.C.

(57) ABSTRACT

An integrated circuit includes a first substrate having a first substrate material, and the first substrate includes a first circuit. A second substrate has a second substrate material different than the first substrate material, and the second substrate includes a second circuit. A conductive interconnect electrically connects the first circuit and the second circuit.

20 Claims, 9 Drawing Sheets

(56) References Cited

U.S. PATENT DOCUMENTS

| | | |
|---|---|---|
| 2017/0148756 A1 | 5/2017 | Yu et al. |
| 2022/0302088 A1 | 9/2022 | Yang et al. |
| 2023/0130626 A1 | 4/2023 | Or-Bach et al. |

OTHER PUBLICATIONS

Liao et al., "3D IC heterogeneous integration of Gps Rf Receiver, Baseband, and DRAM on CoWoS with System BIST Solution," Symposium on VLSI Circuits Digest of Technical Papers, pp. C18-C19 (2013).

Lu et al., "Die-on-Wafer and Wafer-Level Three-Dimensional (3D) Integration of Heterogeneous IC Technologies for RF-Microwave-Millimeter Applications," Mater. Res. Soc. Symp. Proc., vol. 833, pp. G6.8.1-G6.8.6 (Copyright 2005).

Lu, "3-D Hyperintegration and Packaging Technologies for Micro-Nano Systems," Proceedings of the IEEE, vol. 97, No. 1, pp. 18-30 (Jan. 2009).

Shulaker et al., "Monolithic 3D Integration of Logic and Memory: Carbon Nanotube FETs, Resistive RAM, and Silicon FETs," IEEE International Electron Devices Meeting, pp. 638-641 (2014).

Wang et al., "Power Saving and Noise Reduction of 28nm CMOS RF System Integration Using Integrated Fan-Out Wafer Level Packaging (InFO-WLP) Technology," IEEE International 3D Systems Integration Conference, pp. 106-109 (2015).

Yahalom et al., "Analog-Digital Partitioning and Coupling in 3D-IC for RF Applications," IEEE International 3D Systems Integration Conference (3DIC), pp. 1-4 (2016).

* cited by examiner

300

310 — PROVIDE FIRST & SECOND SUBSTRATES

312 — RECEIVE INPUT SIGNAL BY INPUT CIRCUIT

314 — RECEIVE INPUT SIGNAL BY MATCHING CIR.

316 — PROVIDE OUTPUT SIGNAL

318 — GENERATE RF SIGNAL

320 — RECEIVE OUTPUTS BY MIXER

RFIC WITH SUBSTRATE PARTITION

BACKGROUND

Integrated circuits, such as radio frequency (RF) integrated circuits, may include, for example, an RF amplifier gain stage, an oscillator including a cross-coupled transistor pair and a mixer such as gilbert mixer implemented by a common-source transistor or cascode structure. Further, input, output and inter-stage matching networks that are realized by using passive inductive and capacitive elements may be included. Typically, such RF integrated circuits are implemented on a single substrate, such as a silicon substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
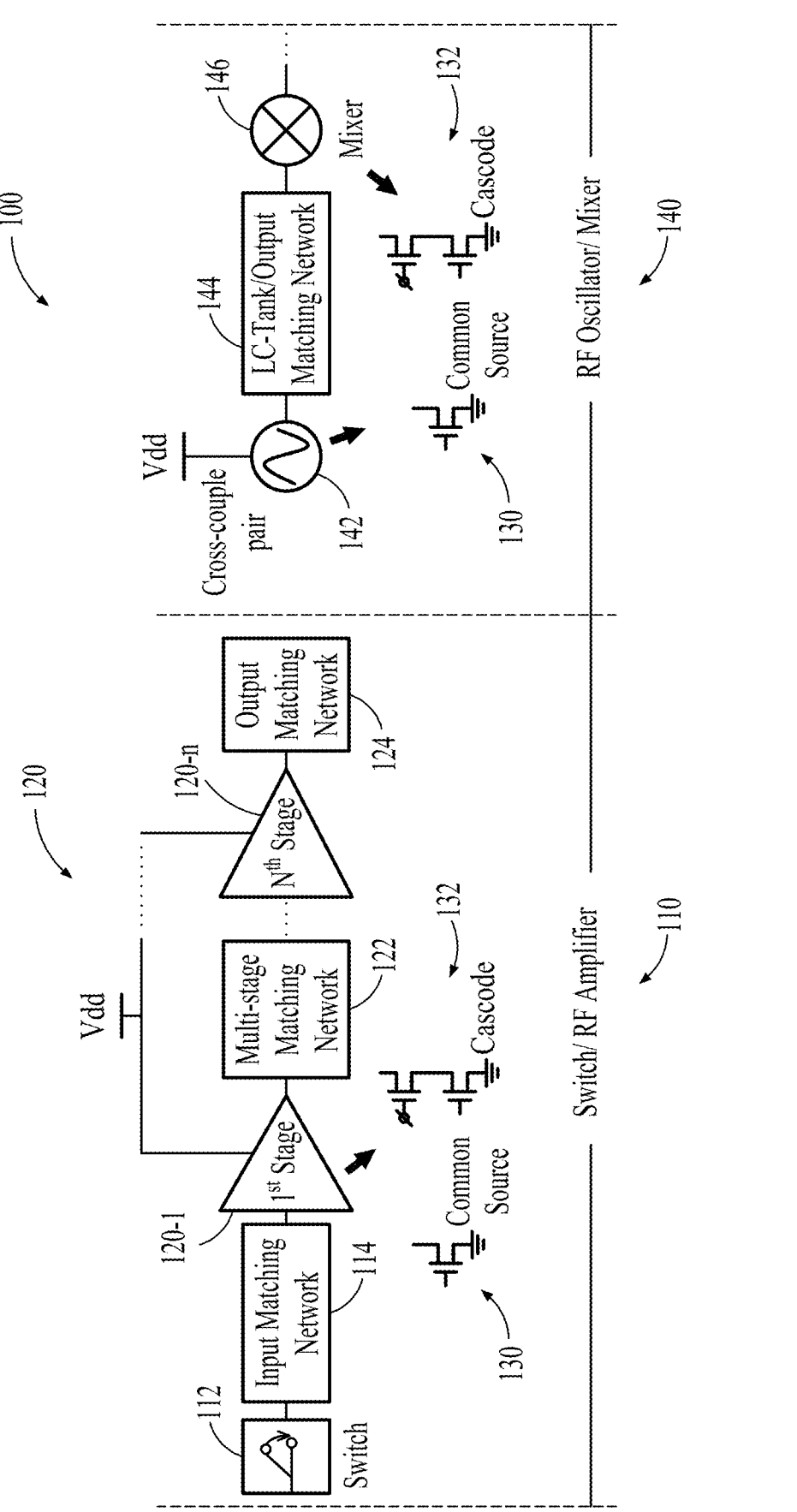
FIG. 1 is a block diagram illustrating an example of a radio frequency (RF) integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A radio frequency (RF) integrated circuit (RFIC) may include, for example, an RF amplifier gain stage, an oscillator and a mixer. Additionally, input, output and inter-stage matching networks that are realized by using passive inductive and capacitive elements may be included. Typically, such RFICs. However, one substrate or one type of substrate is not necessarily suitable or optimized for all kinds of RF circuit designs, For example, a lossy substrate could result in unacceptable signal loss, thus constraining RF circuit performance. While using a substrate with more advanced substrate materials could improve performance, it could also provide an unwanted increase in device costs.

Some disclosed embodiments provide substrate partitioning for RFICs to optimize the RF performance by using a proper substrate for particular RF circuits, while keeping substate costs in check. Substrate partitions are applied to RF circuit designs based on system level, sub-block, active/passive elements, etc. to enhance RF circuit performance as well as managing substrate costs. More particularly, passive elements for circuit matching circuits can be partitioned, for example, to high-resistance substrates for loss reduction, while active devices for the core of the RF circuit can be partitioned to SOI or other advanced-node substates for performance enhancement. Still further, deep N-well (DNW) device construction is often employed to avoid body effect and improve reliability in RF circuits. Disclosed substate partition techniques achieve these goals while avoiding a DNW implementation. Technology optimization for RFICs is further disclosed, where substrate partitioning is implemented based on low-noise requirements, high voltage circuit requirements, low-flicker requirements, and the like for RF circuits such as RF low noise amplifiers (LNA), RF power amplifiers (PA) and RF oscillator circuits.

Thus, aspects of the disclosure provide various substrate partitions for an RFIC, such as substrate partitions based on system level, sub-block, active/passive elements, etc. to enhance RF circuit performance such improvements in gain, noise reduction, and increased reliability with reduced power consumption. By partitioning substrates based on device aspects such as function block, circuit type, device operation, etc., advantages of the different substrate materials may be achieved and allow improved RF system block integration.

For example, some disclosed examples provide an integrated circuit that includes a first substrate formed with a first substrate material that includes a first circuit. Examples of the first circuit include an RF or other high frequency circuit such as an RF LNA. Such high frequency circuits may include passive components, such as those included in matching network circuits. In some implementations, examples of the first substrate material include a high resistance substrate, SOI, etc.

A second substrate is formed with a second substrate material different than the first substrate material. Examples of the second substrate material include silicon. The second substrate also includes a second circuit, such as an amplifier circuit. A conductive interconnect, such as a via, solder bump, bonding pad, etc., electrically connects the first circuit and the second circuit. In some examples, the first circuit includes a common gate circuit, the second circuit includes a common source circuit, and the conductive interconnect electrically connects the common gate circuit to the common source circuit.

Specific examples may include an RF circuit such as an RF LNA that has an RF amplifier stage with a silicon substrate forming an amplifier circuit and a high-resistance substrate, such as an SOI or glass substrate, forming a first matching network circuit. A first conductive interconnect electrically connects the amplifier circuit and the matching network circuit. The circuit further includes an RF oscillator circuit that has an RF oscillator circuit formed on the silicon substrate. The high-resistance substrate also forms a second matching network circuit. A second conductive interconnect electrically connects the RF oscillator circuit and the second matching network circuit. Examples of the first and second conductive interconnects include vias, solder bumps, bonding pads, and the like.

Some implementations further include a third substrate formed with a third substrate material that has a third circuit. The conductive interconnect electrically connects the third circuit to at least one of the first circuit and/or the second circuit.

Other embodiments are expressed as a method that includes providing a first substrate formed from a first substrate material, such as glass or SOI. A second substrate is provided that is formed from a second substrate material different than the first substrate material, such as silicon. An input signal is received by an input circuit formed on the second substrate. The input signal from the input circuit is further received by a matching network circuit formed on the first substrate. An output signal is provided by the matching network to an output matching circuit formed on the first substrate. An RF signal is generated by an oscillator circuit formed on the second substrate, and an output of the output matching circuit and an output of the oscillator circuit are received by a mixing circuit formed on the second substrate.

Providing such various substrate partitions for an RFIC, such as substrate partitions based on system level, subblock, active/passive elements, etc. may enhance RF circuit performance. The performance improvements may include gain increase, noise reduction, increased reliability, etc. As noted above, the substrates are partitioned based on function blocks, circuit type, device operation, etc., to realize advantages of the different substrate materials and facilitate improved RF system block integration.

FIG. 1 illustrates an example of an integrated circuit 100 configured for providing RF communications or operations. The illustrated RFIC 100, may include, for example, an RF input circuit 110 and an RF output circuit 140. The RF input circuit 110 includes an input switch 112 that receives and routes RF input signals, and an amplifier circuit 120. The amplifier circuit 120 is a multistage amplifier in the illustrated example, including a first stage 120-1 through an Nth stage 120-n. An input matching network circuit 116 is connected between an output of the switch 112 and the first amplifier stage 120-1 of the amplifier circuit 120.

A multi-stage matching network 122 is connected between stages of the amplifier 120. In the example of FIG. 1, an inter-stage matching network 122 is connected between stages of the amplifier 120 (e.g., shown between the first amplifier stage 120-1 and the Nth amplifier state 120-n in FIG. 1). An output matching network 124 is connected to an output of the final, or Nth amplifier stage 120-n.

The RF output circuit 140 includes an oscillator circuit 142 configured to generate a carrier frequency signal. A mixer circuit 146, such as a gilbert mixer circuit, combines the RF signal output by the output matching network 124 with carrier signal output by the oscillator 142. An LC-Tank/output matching network 144 is connected between the oscillator 142 and the mixer 146.

Some portions of the integrated circuit 100, such as the input switch 112, amplifier 120, oscillator 142 and mixer 146, include active components such as transistors. In some implementations, these include CMOS transistors. For example, the amplifier stages 120-1 . . . 120-n, the oscillator 142 and/or the mixer 146 may include cross-coupled transistor pair circuits implemented by common source 130 and/or multi-transistor cascode 132 arrangements.

Figure 2:
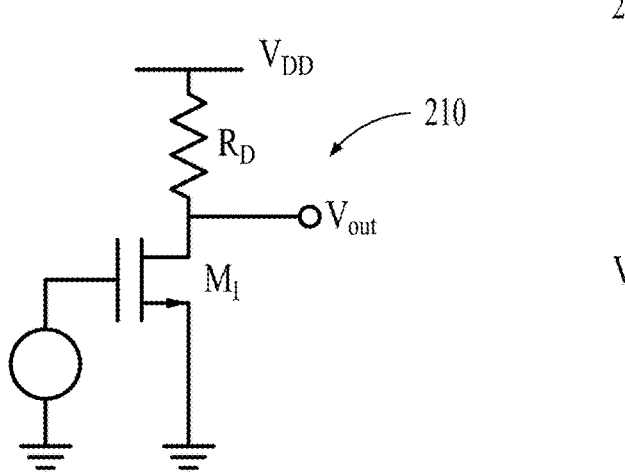
FIG. 2 is a schematic diagram illustrating an example of a common gate circuit in accordance with some embodiments.

FIG. 2 illustrates an example of a common source circuit 210, which may be employed by the amplifier circuit 120, the oscillator circuit 142, and/or the mixer circuit 146. The common source circuit includes a CMOS transistor M1 receiving an input signal Vin at its gate terminal and an output node Vout at its drain terminal. A load resistor RD is connected between the drain terminal of the transistor M1 and a VDD terminal. The transistor M1 converts variations in the gate-source voltage into a small signal drain current which passes through the resistive load RD and generates the amplified voltage across the load resistor RD.

Figure 3:
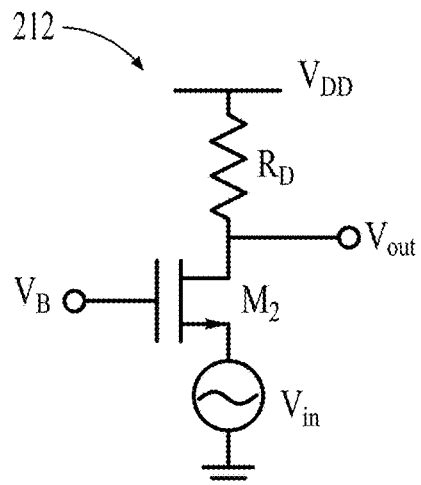
FIG. 3 is a schematic diagram illustrating an example of a common source circuit in accordance with some embodiments.

FIG. 3 illustrates an example of a common gate circuit 212, which may be employed by the amplifier circuit 120, the oscillator circuit 142, and/or the mixer circuit 146. The common gate circuit includes a CMOS transistor M2 receiving a bias signal VB at its gate terminal with an input signal Vin sensed at its source terminal. An output node Vout is provided at its drain terminal. A load resistor RD is connected between the drain terminal of the transistor M2 and a VDD terminal.

Figure 4:
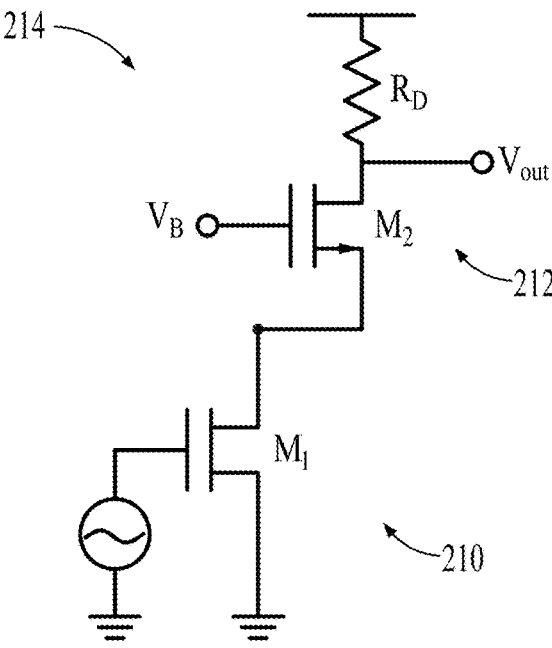
FIG. 4 is a schematic diagram illustrating an example of a cascode circuit in accordance with some embodiments.

FIG. 4 illustrates an example of a cascode circuit 214, which also may be employed by the amplifier circuit 120, the oscillator circuit 142, and/or the mixer circuit 146. The cascode circuit 214 is a two-stage amplifier that includes the common source circuit 210 feeding into the common gate circuit 212. More specifically, the output of the common source circuit 210 is connected to the input of the common gate circuit 212. As such, the input signal Vin is first amplified by the common source circuit 210, and its the amplified output signal is further amplified by the common gate circuit 212.

Figure 5:
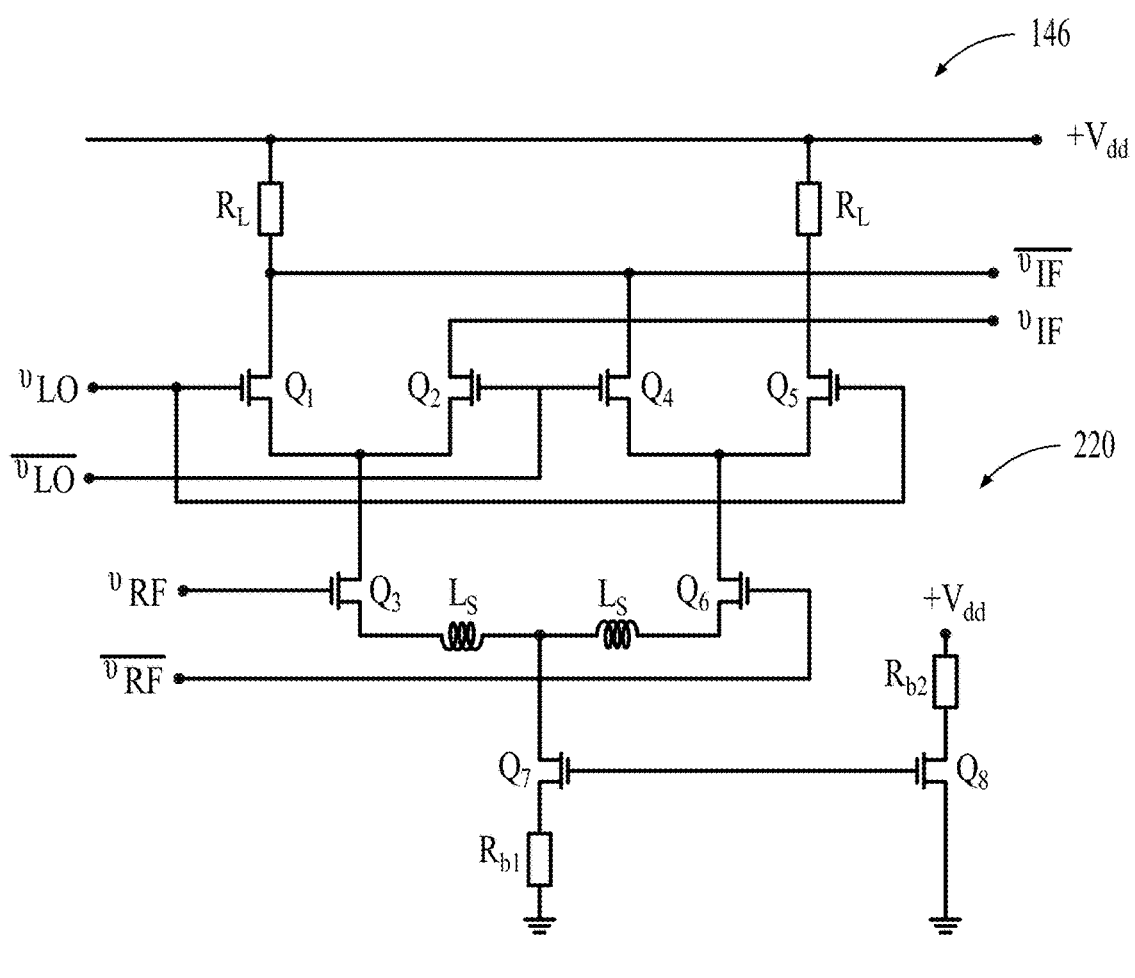
FIG. 5 is a schematic diagram illustrating an example of a mixer circuit in accordance with some embodiments.

FIG. 5 illustrates an example of the mixer circuit 146. The example illustrated in FIG. 5 is a Gilbert mixer circuit 220 that employs a cascode arrangement such as that shown in FIG. 4. The mixer circuit 220 produces output signals that are proportional to the product of two input signals. Two differential amplifier stages are formed by cross-coupled transistor pairs Q1/Q2, Q4/Q5. One source/drain terminal of these transistors is connected to a load resistor RL. The other drain/source terminal of these transistors are connected to a third differential transistor pair Q3/Q6, which receive differential input signals VRF and VRFbar at their gate terminals. Source terminals of the transistors Q3/Q6 may further be connected to inductors LS and a resistor RB1 through a transistor Q7. In the illustrated example, the transistor Q7 is connected in a current mirror configuration with resistor RB2 and transistor Q8.

Figure 6:
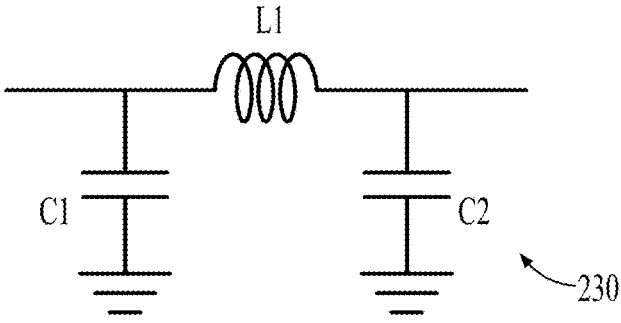
FIG. 6 is a schematic diagram illustrating an example of a matching circuit in accordance with some embodiments.

The matching networks 114, 122, 124, 144 include passive inductive and capacitive elements in some embodiments. FIG. 6 illustrates an example of an LC matching circuit 230 that may be employed by one or more of the matching networks 114, 122, 124, 144. The LC circuit 230 includes passive components, such as an inductor L1 connected between capacitors C1, C2.

In some embodiments, the RF integrated circuit 100 is implemented on a single substrate, such as a silicon substrate, as a monolithic system on chip (SoC). However, one substrate is not necessarily suitable or optimized for all of the various RF circuits included in the RFIC 100 shown in FIG. 1. Using a single substrate may result in reduced performance and/or increased substrate costs. For instance, implementing the entire RFIC 100 on a lossy silicon substrate could result in signal loss, degrading performance. On the other hand, implementing the RFIC 100 on a lossless or low loss substrate (e.g. a substrate using an advanced substrate material) could provide better RF performance, but could also significantly increase costs, especially since certain components or individual circuits of the IC 100 would not necessarily have performance degradation from a lossy substrate.

In accordance with aspects of this disclosure, a substrate partition is provided for the RFIC 100 to optimize the RF performance by using optimized substrate material determined from a system/circuit/device design point of view, while managing substrate costs by using lower cost substrate materials for circuits or portions of circuits where circuit performance is not affected.

For instance, passive elements such as for the matching network circuits are partitioned to high resistance (high-R) substates for loss reduction in some examples, while active devices for the core of the RF circuit (e.g. switch 112, amplifier stages 120-1 . . . 120-n, oscillator 142, mixer 143, etc.), are partitioned to advanced-node substate materials (e.g. silicon-on-insulator (SOI)) for performance enhancements.

Still further, for active portions of the RF circuit 100, such as cascode amplifier circuits, a deep N-well (DNW) device is often employed to avoid body effect and improve reliability in the circuit. However, the DNW device also can increase loss effects, while adding complexity and cost to manufacture of the circuit. In some disclosed examples, the substate partition is used to avoid a DNW implementation, while avoiding body-effect and reliability issues. Substrate partitioning as disclosed herein also may provide technology optimization for RF systems. For example, issues associated with low-noise devices, high-voltage devices, low-flicker devices in low noise amplifiers (LNA), power amplifiers (PA), voltage controlled oscillators (VCO) are addressed with disclosed substrate partition concepts.

Figure 7:
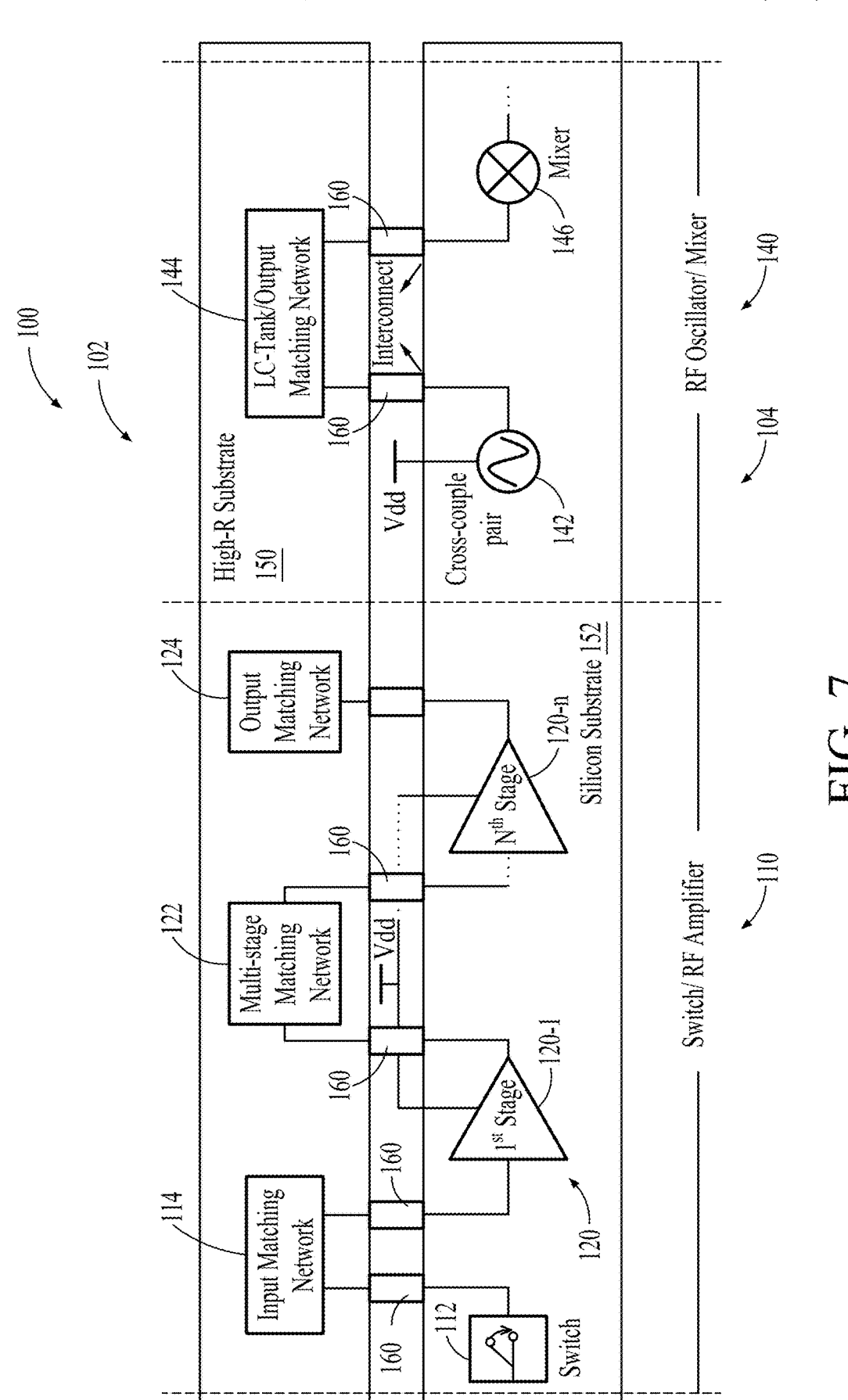
FIG. 7 is a block diagram illustrating further aspects of the example RFIC of FIG. 1 in accordance with some embodiments.

FIG. 7 illustrates an example of the RFIC 100 employing substrate partitioning in accordance with aspects of the present disclosure. The example RFIC 100 shown in FIG. 7 includes a first substrate 150 formed with a first substrate material and a second substrate 152 formed with a second substrate material different than the first substrate material. As with the example illustrated in FIG. 1, the RFIC 100 includes the RF input circuit 110 and the RF output circuit 140. The first substrate 150 has first circuit portions 102 of the RF input circuit 110 and RF output circuit 140, and the second substrate 152 has second circuit portions 104 of the input circuit 110 and RF output circuit 140. Conductive interconnects 160 electrically connect the first circuit portions and the second circuit portions.

In the example of FIG. 7, the first substrate 150 has a first substrate material forming a high-R substrate, having a resistance in a range from about 750 ohms-centimeter to 10,000 ohms-centimeter. The first substrate 150 includes the first circuit portions 102 of the RF input circuit 110 and the RF output circuit 140—i.e., the matching network circuits 114, 122, 124 and 144. The second substrate 152, which has a second substrate material such as silicon in the illustrated embodiment, includes the second circuit portions 104 of the RF input circuit 110 and the RF output circuit 140—i.e., the switch circuit 112, the amplifier 120, the oscillator 142 and the mixer 146.

To reduce loss effects that could result from a lossy silicon substrate, the first circuit portion 102—i.e., matching networks 114, 122, 124, 144 are implemented on a lossless or low loss high-R substrate, which could include an SOI or glass substate, for example. This provides improved performance for these circuits at RF frequencies.

In the example shown in FIG. 7, the second substrate 152 is a silicon substrate. Such a silicon substrate 152 may be a bulk substrate of monocrystalline silicon or some other semiconductor. In some embodiments, the substrate may alternatively or additionally include other elementary semiconductor(s), such as germanium. The substrate may also include a compound semiconductor, such as silicon carbide, gallium arsenic, indium arsenide, and indium phosphide.

As noted above, in some examples the first substrate 150 is an SOI substrate. An SOI substrate is a semiconductor wafer technology that produces higher performing, lower power (dynamic) devices than traditional bulk silicon techniques. SOI works by placing a thin, insulating layer, such as silicon oxide between a thin layer of silicon and the silicon substrate. Thus, the SOI substrate is a layered silicon-insulator-silicon substrate, which reduces parasitic capacitance within the device, thereby improving performance. SOI-based devices differ from conventional silicon-built devices in that the silicon junction is above an electrical insulator, typically silicon dioxide or sapphire (these types of devices are called silicon on sapphire, or SOS).

In other examples, the first substrate 150 is a glass substrate, which includes a glass layer that may be formed of silicon dioxide $SiO_2$, lithium superoxide $LiO_2$, cerium dioxide $CeO_2$, aluminum oxide $Al_2O_3$, boron trioxide $B_2O_3$, or the like. An oxide layer, such as silicon oxide SiO may be formed on the surface of the glass layer. In some embodiments, a thickness of the glass substrate is less than about 800 μm, or less than about 200 μm in further embodiments.

As discussed further below, in various implementations the substrate partitioning is achieved by various package technologies, such as fan out arrangements, interposers, ball grid arrays, multi-chip packages, etc. The interconnect could be bonding, bump, Cu_Via, etc. The interconnects 160 may be implemented, for example by conductive vias, bonding pads, conductive bumps, etc.

Figure 8:
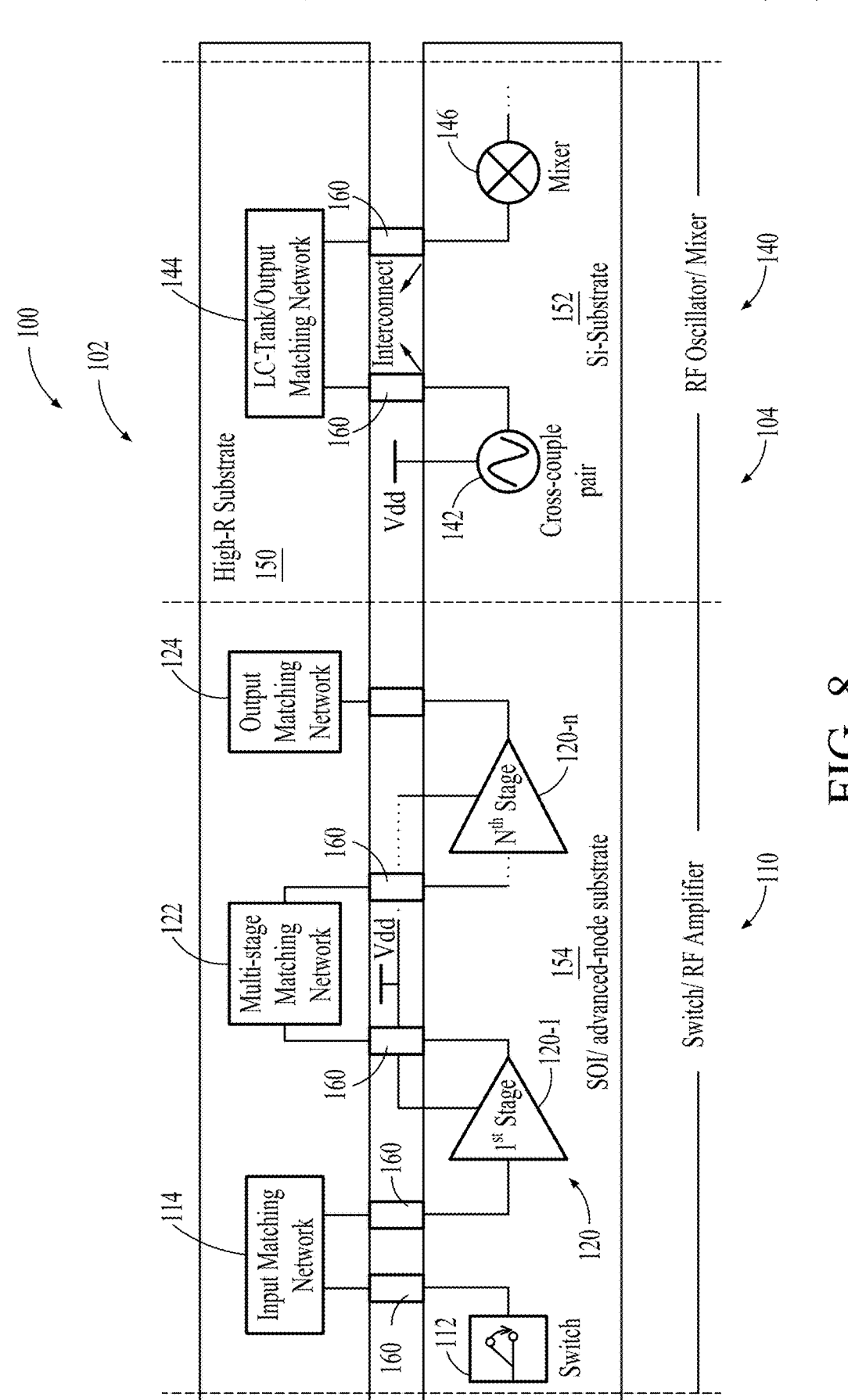
FIG. 8 is a block diagram illustrating another example of the RFIC in accordance with some embodiments.

FIG. 8 illustrates another embodiment in which a third substrate 154 having a third substrate material is provided. Using an SOI substrate for an entire RF device such as the RFIC 100 may provide superior performance compared to a silicon substrate. However, increased costs are associated with such an SOI substate. In the example shown in FIG. 8, a third substrate 154 formed with a third substrate material different than the first and second substrate materials is included. The third substrate 154 may include an SOI substrate, which is a layered silicon-insulator-silicon substrate, which reduces parasitic capacitance within the device, thereby improving performance. The silicon junction is above an electrical insulator, typically silicon dioxide or sapphire, thus referred to as silicon on sapphire, or SOS. The second substrate 152 and the third substrate 154 are partitioned for the second circuit portion 104, or the active circuits, between the RF input circuit 110 and RF output circuit 140.

Figures 9, 10:
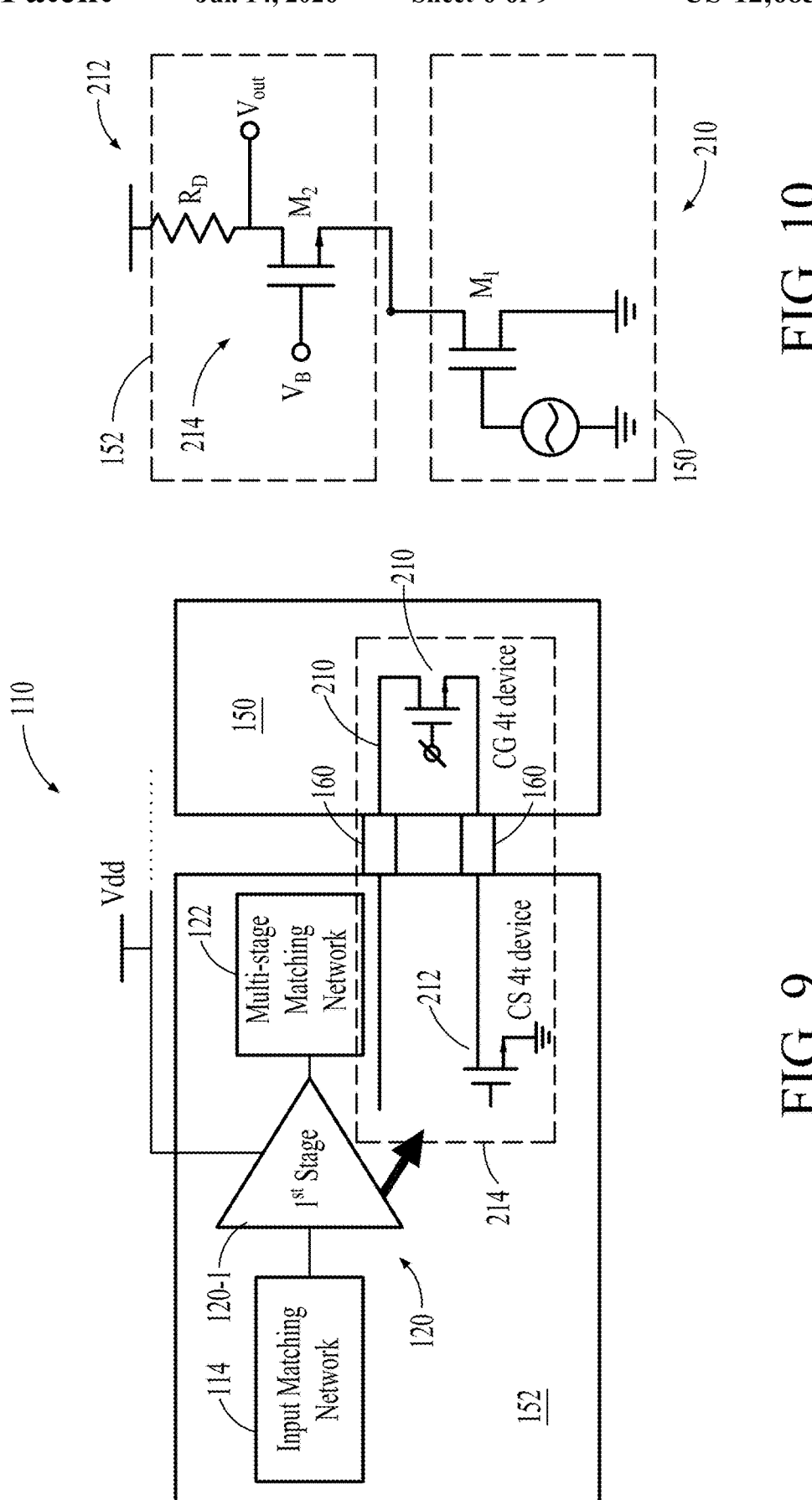
FIG. 9 is a block diagram illustrating an example of an amplifier circuit in accordance with some embodiments.
FIG. 10 is a schematic diagram illustrating the example amplifier circuit shown in FIG. 9 in accordance with some embodiments.

More particularly, the switch circuit 112 and the first amplifier stage 120-1 through the Nth amplifier stage 120-n of the amplifier circuit 120 are partitioned to the third substrate 154, which is an advanced node substrate such as an SOI substrate in the example of FIG. 8 as noted above. To reduce loss effects that could result from a lossy silicon substrate, the matching networks 114, 122, 124, 144 are implemented on the first substrate 150, which could be a lossless or low loss high-R substrate. In the example of FIG. 8, the high-R substrate may have a resistance in a range from about 750 ohms-centimeter to 10,000 ohms-centimeter. Such a glass substrate may include a glass layer formed of silicon dioxide $SiO_2$, lithium superoxide $LiO_2$, cerium dioxide $CeO_2$, aluminum oxide $Al_2O_3$, boron trioxide $B_2O_3$, or the like. An oxide layer, such as silicon oxide SiO may be formed on the surface of the glass layer, which may have a thickness less than about 800 μm, or less than about 200 μm in further embodiments. This provides improved performance for these circuits at RF frequencies. The oscillator circuit 142 and mixer 146 are implemented on the second substrate 152, which is a silicon substrate. This allows improved RF operation of the RFIC 100 while managing costs. FIG. 9 illustrates an example of RF input circuit 110 of the RFIC 100, where the amplifier circuit 120 is partitioned onto two different substrates 150, 152. As noted above, the amplifier stages 120-1 . . . 120-n of the amplifier circuit 120 include cascode common gate circuits, such as the cascode amplifier circuit 214 shown in FIG. 4. Often, such cascode common gate circuits are implemented as a deep N-well (DNW) device to avoid body-effect and reliability issues. More specifically, in some instances the common gate circuit 210 of the cascode circuit 214 is implemented as a DNW device to avoid such issues. However, such DNW devices can result in increased signal loss effects and typically require more masks in the manufacturing process.

In the embodiment shown in FIG. 9, the common gate portion 210 of the cascode circuit 214 is implemented in/on the first substrate 150, which may be a high-R substrate such as a glass substrate in some examples. The common source portion 212 is formed in/on the second substrate 152, which may be a silicon substrate, for example. FIG. 10 is a schematic diagram illustrating the cascode circuit 214 shown in FIG. 4, and further conceptually illustrating the common source circuit 212 implemented in the second substrate 152, and the common gate circuit 210 implemented in the first substrate 150. Conductive interconnects 160 connect the common source circuit 212 to the common gate circuit 210 to form the cascode circuit 214.

More specifically, the common source circuit 210 includes the CMOS transistor M1 that receives the input signal Vin at its gate terminal and provides an output signal at its drain terminal. The transistor M1 converts variations in the gate-source voltage into a small signal drain current is output to the common gate circuit 212. The common source circuit 210 is formed in/on the first substrate 150, which may be a high-R substrate, for example. The common gate circuit 212 includes the CMOS transistor M2 that receives a bias signal VB at its gate terminal. The output signal of the common source circuit 210 is sensed at the source terminal of the transistor M2. An output node Vout is provided at the drain terminal of the transistor M2. The load resistor RD is connected between the drain terminal of the transistor M2 and the VDD voltage terminal. The common gate circuit 212 is formed in/on the second substrate 152, which is a silicon substrate in some examples.

The common source circuit 210 together with the common gate circuit 212 together form the two-stage amplifier cascode circuit 214, in which the input signal Vin is first amplified by the common source circuit 210, and its the amplified output signal is further amplified by the common gate circuit 212.

Implementing the cascode circuit(s) 214 of the amplifier 120 with a substrate partition as shown in FIGS. 9 and 10 not only releases DNW constraints, but also avoids body-effect issues.

Figure 11:
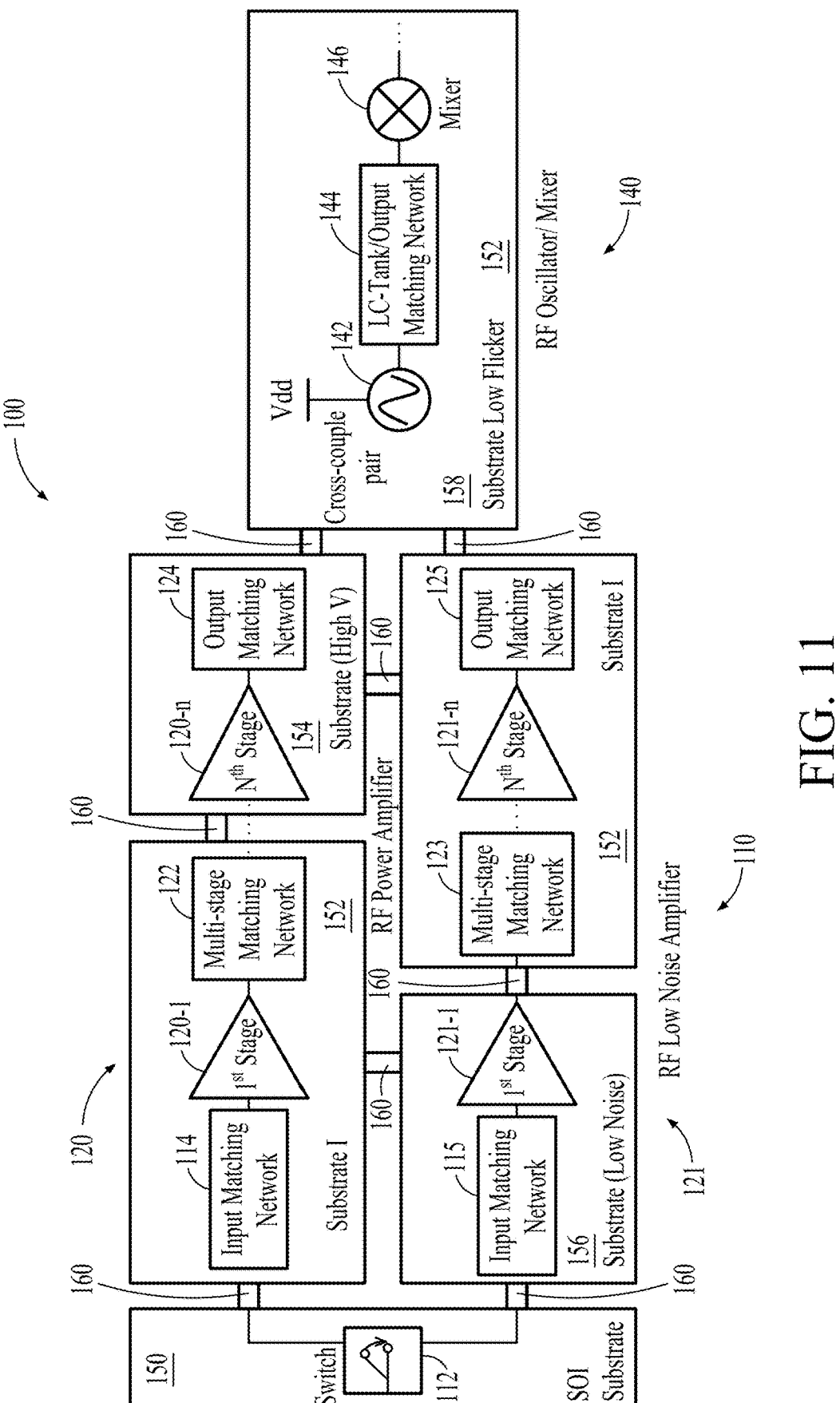
FIG. 11 is a block diagram illustrating another example of the RFIC in accordance with some embodiments.

FIG. 11 illustrates another example with further substrate partitioning. As noted above, one substrate technology may not be suitable for all portions of the RFIC 100. In the illustrated embodiment, the input switch 112 is implemented with the first substrate 150, which is an SOI substrate.

In the example of FIG. 11, the amplifier 120 is an RF power amplifier. The input matching network 114 and the first power amplifier stage 120-1 are implemented with the second substrate 152, which may be for example a silicon substrate. The final stage 120-n of the power amplifier 120 and the output matching network 124 use a third substrate 154, such as a high-voltage (high-V) substrate. The high-V substrate may include a ceramic material, such as Alumina ($Al_2O_3$), Aluminium nitride (AlN), Silicon nitride (SiN), Beryllium oxide (BeO), and the like.

The embodiment shown in FIG. 11 further includes a low noise amplifier 121, where the first low noise amplifier stage 121-1 is implemented using a fourth substrate 156, such as a low noise substrate SOI substrate. An input matching network circuit 115 is also implemented with the fourth substrate 156. Further low noise amplifier stages, such as the final amplifier stage 121-n, may be formed using the second substrate 152 or an additional similar substrate. A multistage matching network 123 and output matching network 125 may further be implemented using the same substrate as the final low noise amplifier stage 121n.

In some examples, the oscillator circuit 142 is implemented using a fifth substrate 158, which may be a low flicker substrate such as a glass substrate. The oscillator output matching network circuit 144 and mixer circuit 146 may also be implemented with the fifth substrate 158.

Such substrate partitioning can optimize legacy circuit design aspects, performance aspects, cost/space, aspects, etc. for the various circuit blocks to improve system block integration.

Figure 12:
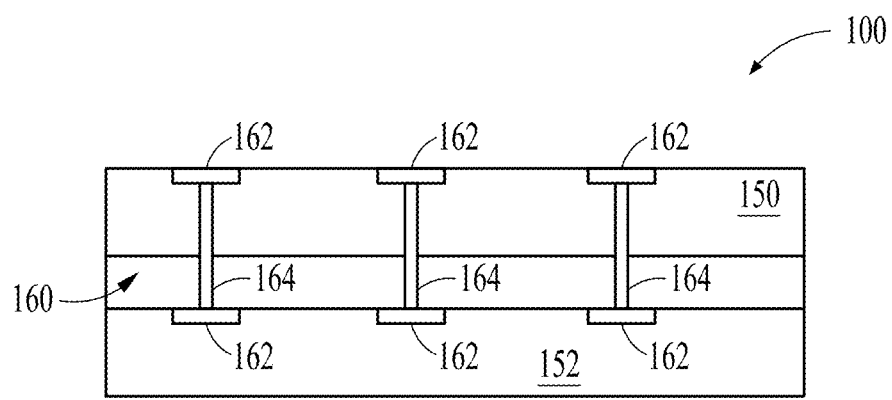
FIG. 12 is a block diagram illustrating further aspects of an example of the RFIC in accordance with some embodiments.

As noted above, various packaging technologies may be employed for the various substrates and their respective RF circuits. FIG. 12 illustrates an example where the first substrate 150 and the second substrate 152 are in a stacked configuration to form a 3D IC structure. The conductive interconnects 160 may be in the form of through substrate conductive vias 164, extending from contact pads 162 on a front or back side of the first substrate 150 to corresponding pads of the second substrate 152.

Figure 13:
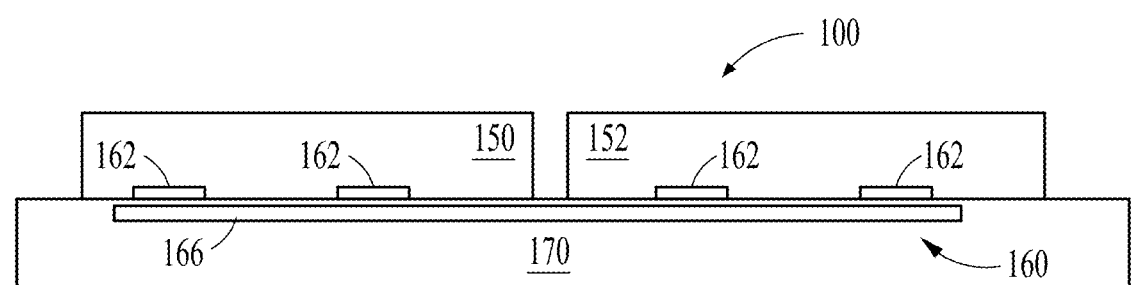
FIG. 13 is a block diagram illustrating further aspects of another example of the RFIC in accordance with some embodiments.

FIG. 13 illustrates an example where the first substrate 150 and the second substrate 152 are arranged side-by-side on an interposer 170. The first substrate 150 and the second substrate 152 may be bonded through micro-bumps on the interposer. In FIG. 13, the conductive interconnects 160 may include contact pads 162 that are interconnected by conductive tracks 166 of the interposer 170.

Figure 14:
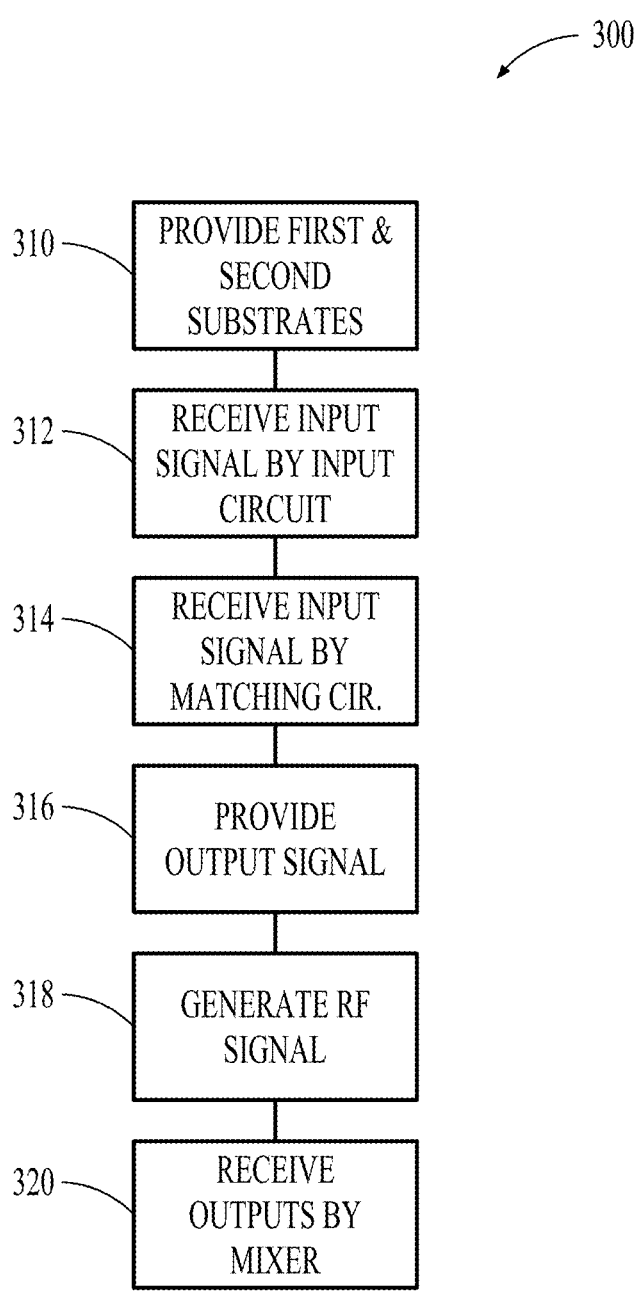
FIG. 14 is a flow diagram illustrating an example of a circuit operation method in accordance with some embodiments.

FIG. 14 illustrates an example of a method for operating an RF circuit, such as the RFIC 100 shown in FIG. 7. The method 300 includes providing a first substrate and second substrates at step 310. As in the embodiment of FIG. 7, the first substrate 150 comprises a first substrate material, which may be a high resistance substrate such as glass or SOI in some examples. The second substrate 152 comprises a second substrate material different than the first substrate material, such as silicon. At step 312, an input signal is received by an input circuit 110, such as the input switch circuit 112 and the amplifier 120 formed on the second substrate 152. The amplifier circuit is an RF LNA that includes a common gate circuit and a common source circuit in some embodiments. The input signal from the input circuit is received by a matching network circuit, such as the matching network circuits 114, 122 and 124 formed on the first substrate 150 at step 314. The matching network includes passive components in some examples. At step 316, an output signal is provided by the matching network 124 to an output matching circuit 144 formed on the first substrate 150. An RF signal is generated by an oscillator circuit 142 formed on the second substrate 152 at step 318, and at step 320 an output of the output matching circuit 144 and an output of the oscillator circuit 142 is received by a mixing circuit formed 146 formed on the second substrate 152. The matching network circuits 114, 122 and 124 may be electrically connected to the one or more stages of the amplifier circuit 120 by conductive interconnects (e.g. vias, a solder bumps, bonding pads, etc.) In some implementations, a third substrate formed by a third substrate material is further provided. The third substrate includes a third circuit, which may include, for example, one or more amplifier stages of the RF LNA. The conductive interconnect electrically connects the third circuit to at least one of the first circuit and/or the second circuit.

Thus, aspects of the disclosure provide various substrate partitions for an RFIC 100, such as substrate partitions based on system level, sub-block, active/passive elements, etc. to enhance RF circuit performance such improvements in gain, noise reduction, and increased reliability with reduced power consumption. By partitioning substrates based on device aspects such as function block, circuit type, device operation, etc., advantages of the different substrate materials may be achieved and allow improved RF system block integration.

In accordance with aspects of the disclosure, an integrated circuit has a first substrate comprising a first substrate material, and the first substrate includes a first circuit. A second substrate comprises a second substrate material different than the first substrate material, and the second substrate includes a second circuit. A conductive interconnect electrically connects the first circuit and the second circuit.

In accordance with further aspects, an RF circuit includes an RF amplifier stage including a silicon substrate forming an amplifier circuit, a high-resistance substrate forming a first matching network circuit, and a first conductive interconnect electrically connecting the amplifier circuit and the matching network circuit. An RF oscillator circuit includes the silicon substrate forming an RF oscillator circuit, and the high-resistance substrate forming a second matching network circuit. A second conductive interconnect electrically connects the RF oscillator circuit and the second matching network circuit.

In accordance with additional aspects of the disclosure, a method includes providing a first substrate comprising a first substrate material and providing a second substrate comprising a second substrate material different than the first substrate material. An input signal is received by an input circuit formed on the second substrate. The input signal from the input circuit is received by a matching network circuit formed on the first substrate. An output signal is provided by the matching network to an output matching circuit formed on the first substrate. An RF signal is generated by an oscillator circuit formed on the second substrate, and an output of the output matching circuit and an output of the oscillator circuit are received by a mixing circuit formed on the second substrate.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first substrate comprising a first substrate material;
a second substrate comprising a second substrate material different than the first substrate material;
a conductive interconnect between the first substrate and the second substrate;
an input circuit formed on the second substrate configured to receive an input signal;
a matching network circuit formed on the first substrate configured to receive the input signal from the input circuit;
an output matching circuit formed on the first substrate configured to receive an output signal from the matching network circuit;
an oscillator circuit formed on the second substrate configured to generate an RF signal; and
a mixing circuit formed on the second substrate configured to receive an output of the output matching circuit and an output of the oscillator circuit.

2. The integrated circuit of claim 1, wherein the first substrate material is a high resistance substrate.

3. The integrated circuit of claim 2, wherein the first substrate material includes glass.

4. The integrated circuit of claim 2, wherein the first substrate material includes silicon on insulator (SOI).

5. The integrated circuit of claim 2, wherein the matching network circuit includes passive components.

6. The integrated circuit of claim 2, wherein the second substrate material includes silicon.

7. The integrated circuit of claim 2, further comprising an amplifier circuit formed on the second substrate.

8. The integrated circuit of claim 7, wherein the amplifier circuit includes a common source device.

9. The integrated circuit of claim 8, further comprising a common gate circuit formed on the first substrate, wherein the conductive interconnect electrically connects the common gate circuit to the common source circuit.

10. The integrated circuit of claim 1, further comprising:

a third substrate comprising a third substrate material, the third substrate including an amplifier circuit; and wherein the conductive interconnect electrically connects the third amplifier circuit to the matching network circuit.

11. The integrated circuit of claim 1, wherein the conductive interconnect includes at least one of a via, a solder bump, and/or a bonding pad.

12. A radio frequency (RF) circuit, comprising:

an RF amplifier stage including:

a silicon substrate forming an amplifier circuit;

a high-resistance substrate forming a first matching network circuit; and a first conductive interconnect electrically connecting the amplifier circuit and the matching network circuit; and an RF oscillator circuit including:

the silicon substrate forming an RF oscillator circuit;

the high-resistance substrate forming a second matching network circuit; and a second conductive interconnect electrically connecting the RF oscillator circuit and the second matching network circuit.

13. The RF circuit of claim 12, wherein the amplifier circuit includes a common source device.

14. The RF circuit of claim 12, wherein the high resistance substrate is a silicon on insulator (SOI) substrate.

15. The RF circuit of claim 12, wherein the high resistance substrate is a glass substrate.

16. The RF circuit of claim 12, wherein the first and second conductive interconnects include at least one of a via, a solder bump, and/or a bonding pad.

17. A method, comprising:

providing a first substrate comprising a first substrate material;

providing a second substrate comprising a second substrate material different than the first substrate material;

receiving an input signal by an input circuit formed on the second substrate;

receiving the input signal from the input circuit by a matching network circuit formed on the first substrate;

providing an output signal by the matching network to an output matching circuit formed on the first substrate;

generating an RF signal by an oscillator circuit formed on the second substrate; and receiving an output of the output matching circuit and an output of the oscillator circuit by a mixing circuit formed on the second substrate.

18. The method of claim 17, wherein the first substrate material includes glass.

19. The method of claim 17, wherein the first substrate material includes silicon on insulator (SOI).

20. The method of claim 17, wherein the second substrate material includes silicon.

* * * * *